(12) United States Patent
Miyao et al.

(10) Patent No.: US 10,377,636 B2
(45) Date of Patent: Aug. 13, 2019

(54) METHOD FOR PRODUCING POLYCRYSTALLINE SILICON ROD, POLYCRYSTALLINE SILICON ROD, AND POLYCRYSTALLINE SILICON MASS

(71) Applicant: SHIN-ETSU CHEMICAL CO., LTD., Tokyo (JP)

(72) Inventors: Shuichi Miyao, Niigata (JP); Junichi Okada, Niigata (JP); Shigeyoshi Netsu, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 147 days.

(21) Appl. No.: 15/309,218

(22) PCT Filed: May 27, 2015

(86) PCT No.: PCT/JP2015/002683
§ 371 (c)(1),
(2) Date: Nov. 7, 2016

(87) PCT Pub. No.: WO2015/186318
PCT Pub. Date: Dec. 10, 2015

(65) Prior Publication Data
US 2017/0073235 A1   Mar. 16, 2017

(30) Foreign Application Priority Data
Jun. 3, 2014   (JP) .................................. 2014-115238

(51) Int. Cl.
*C01B 33/035*   (2006.01)
*C30B 29/06*   (2006.01)

(52) U.S. Cl.
CPC ............ *C01B 33/035* (2013.01); *C30B 29/06* (2013.01)

(58) Field of Classification Search
CPC .............................. C01B 33/035; C30B 29/06
See application file for complete search history.

(56) References Cited

U.S. PATENT DOCUMENTS

2005/0034430 A1   2/2005  Holzlwimmer et al.
2006/0249200 A1*  11/2006  Kato .................... H01L 31/182
                                                    136/258
(Continued)

FOREIGN PATENT DOCUMENTS

CN   102498064 A   6/2012
CN   103420374 A   12/2013
(Continued)

OTHER PUBLICATIONS

International Search Report dated Oct. 13, 2015 in PCT/JP2015/002683, filed May 27, 2015 with English translation.
(Continued)

*Primary Examiner* — Ngoc-Yen Nguyen
(74) *Attorney, Agent, or Firm* — Oblon, McClelland, Maier & Neustadt, L.L.P.

(57) ABSTRACT

A polycrystalline silicon rod is synthesized by the Siemens method (S101). After the polycrystalline silicon rod is covered from above with a plastic bag whose inner surface has been washed, and housed in the plastic bag in a reactor (S103), the polycrystalline silicon rod is removed out of the reactor (S104), and heat-sealed and stored in an enclosed state (S105). According to the present invention, steps conventionally considered as essential, such as washing, etching, and water washing, are not always necessary, and therefore the concentrations of fluorine ions, nitrate ions, and nitrogen dioxide ions remaining on the surface can each be less than 0.2 ppbw. In addition, by covering with the plastic bag, the metal contamination levels decrease significantly. Moreover, when the handling according to the pres- (Continued)

ent invention is performed, surface contamination hardly proceeds even if the polycrystalline silicon rod is stored for a long period.

1 Claim, 1 Drawing Sheet

(56) References Cited

U.S. PATENT DOCUMENTS

| | | |
|---|---|---|
| 2010/0154357 A1 | 6/2010 | Wochner et al. |
| 2012/0052297 A1 | 3/2012 | Pech et al. |
| 2012/0175613 A1 | 7/2012 | Netsu et al. |
| 2013/0025625 A1 | 1/2013 | Wochner et al. |
| 2013/0309524 A1 | 11/2013 | Vietz et al. |
| 2014/0037959 A1 | 2/2014 | Wochner et al. |

FOREIGN PATENT DOCUMENTS

| | | |
|---|---|---|
| CN | 103570021 A | 2/2014 |
| EP | 1 334 907 A1 | 8/2003 |
| EP | 2 152 588 B1 | 5/2011 |
| EP | 2 479 142 A1 | 7/2012 |
| EP | 2 695 974 A1 | 2/2014 |
| JP | 2003-237722 A | 8/2003 |
| JP | 2009-298672 A | 12/2009 |
| JP | 2012-46412 A | 3/2012 |
| JP | 2013-32274 A | 2/2013 |
| JP | 2013-241330 A | 12/2013 |
| JP | 2015-30628 A | 2/2015 |

OTHER PUBLICATIONS

Japanese Office Action dated Nov. 1, 2016 in Japanese Patent Application No. 2014-115238.
Extended European Search Report dated Oct. 26, 2017 in Patent Application No. 15803978.4 citing documents AA-AC and AO-AR therein, 9 pages.
Combined Chinese Office Action and Search Report dated Mar. 30, 2018 in Chinese Patent Application No. 201580029762.7 (with English translation of Category of Cited Documents), citing documents AO, AP and AQ therein, 6 pages.

* cited by examiner

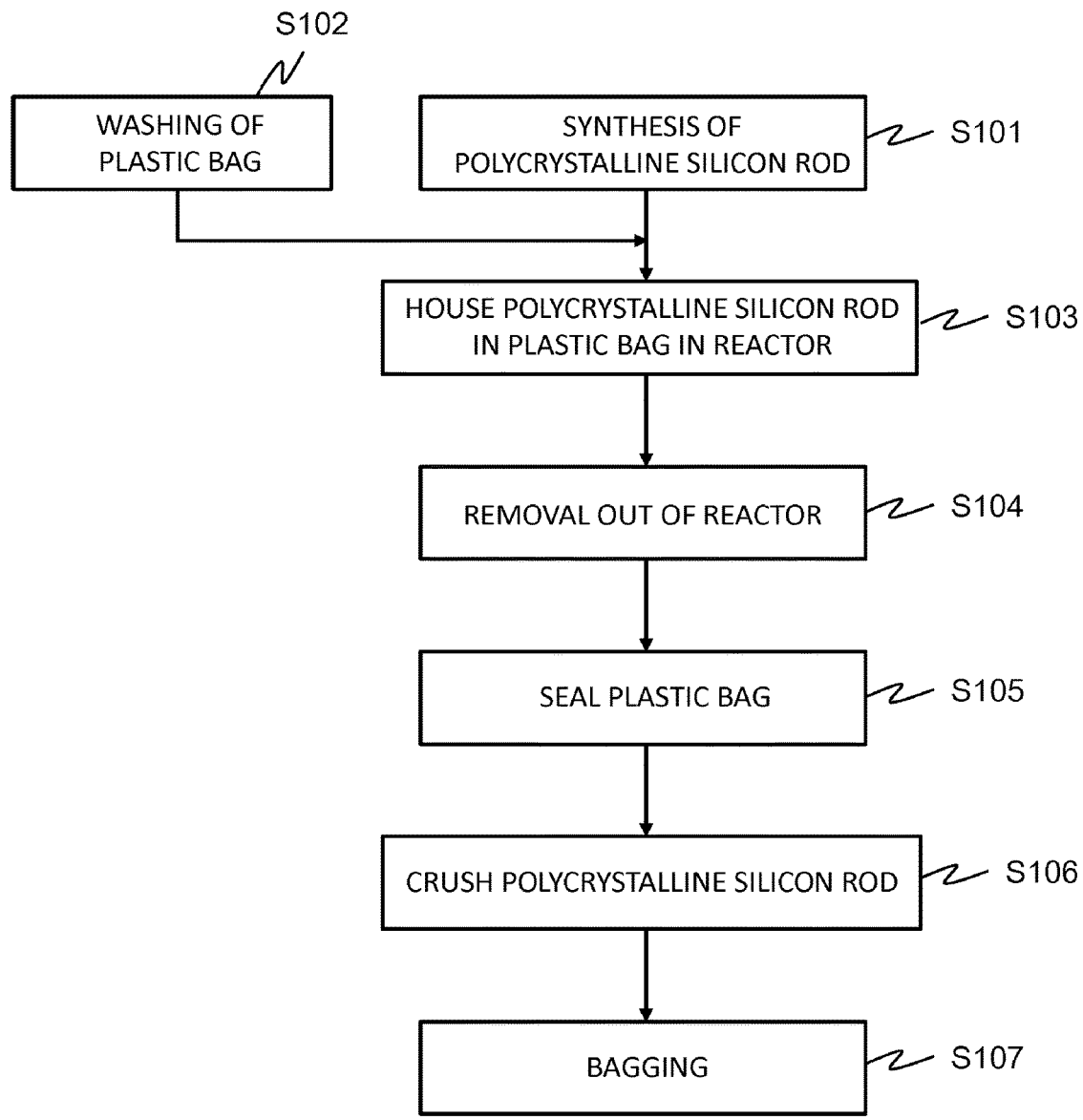

METHOD FOR PRODUCING POLYCRYSTALLINE SILICON ROD, POLYCRYSTALLINE SILICON ROD, AND POLYCRYSTALLINE SILICON MASS

TECHNICAL FIELD

The present invention relates to a surface cleaning technique for a polycrystalline silicon rod.

BACKGROUND ART

In most cases, monocrystalline silicon essential for the manufacture of semiconductor devices and the like is grown by the FZ method or the CZ method using as a raw material a polycrystalline silicon rod produced by the Siemens method or polycrystalline silicon masses obtained by crushing the polycrystalline silicon rod. The Siemens method is a method involving bringing a silane raw material gas such as trichlorosilane or monosilane into contact with a heated silicon core wire to vapor-phase-grow (deposit) polycrystalline silicon on the surface of the silicon core wire by a CVD (Chemical Vapor Deposition) method.

For polycrystalline silicon masses, a polycrystalline silicon rod synthesized by the Siemens method is removed from a reactor and then fractured, and the fractured material is subjected to chemical solution etching with fluoronitric acid or the like in order to remove contaminants adhering to the surface of this fractured material to achieve a surface state with high cleanliness, and commercialized.

When a silicon material such as polycrystalline silicon masses is etched, generally, a mixed acid solution of hydrofluoric acid (HF) and nitric acid ($HNO_3$) or a mixed acid solution comprising hydrogen peroxide ($H_2O_2$) in the above mixed acid solution is used, and each acid concentration in these mixed acid liquids is selected according to the concentrations and degrees of difficulty of removal of contaminants adhering to the silicon material to be washed, and the like.

The components of the mixed acid solution remain on the surface of the silicon material after such etching, and it is necessary to remove these residues by water washing and rinsing. But, when the concentrations of the residual components are high, it is difficult to completely remove the residual components by water washing and rinsing. When monocrystalline silicon is grown by the CZ method using as a raw material polycrystalline silicon masses on the surfaces of which residues are present, a problem is that a phenomenon such as crystal lines, signs of single crystallization, disappearing and being disarranged occurs, and the completeness of the crystal cannot be guaranteed.

The cause of this is not necessarily clarified, but this may be due to the nitrogen (N) component and fluorine (F) in the above mixed acid solution remaining on the surfaces of the polycrystalline silicon masses.

Particularly, an infinite number of cracks and crevices are present in polycrystalline silicon masses, and therefore when the mixed acid solution components enter these gaps, it is next to impossible to completely remove the mixed acid solution components. Such residual components are mainly three types, a nitrate ion component, a nitrite ion component, and a hydrofluoric acid ion component. According to measurement by the present inventors, the following result is also obtained. Even if polycrystalline silicon masses are immersed in pure water at about 40° C. and subjected to ultrasonic washing for 24 hours, these residual components cannot be completely removed.

CITATION LIST

Patent Literature

Patent Literature 1: Japanese Patent Laid-Open No. 2009-298672

SUMMARY OF INVENTION

Technical Problem

Patent Literature 1 (Japanese Patent Laid-Open No. 2009-298672) discloses a technique for simply and reliably preventing an abnormal oxidation phenomenon referred to as stains occurring on the surfaces of bagged fractured masses of polycrystalline silicon during the storage of the fractured masses. Specifically, based on the finding that in the case of fractured masses of polycrystalline silicon, the possibility that the remaining of a fluorine component due to insufficient draining occurs in some portions of some fractured masses and the portions develop into abnormal oxides referred to as stains is considered, a method for producing polycrystalline silicon characterized in that fractured masses of polycrystalline silicon are treated with a washing liquid comprising fluorine, water-washed, dried, and then held under reduced pressure at a temperature of 45° C. or more for 20 minutes or more while an inert gas having a dew point of −35° C. to −20° C. is flowed is proposed.

A problem of such treatment is that the producing cost of polycrystalline silicon masses is increased, however, in a sense that it is necessary to newly provide a step for setting the number of fluorine atoms remaining on the surfaces of polycrystalline silicon masses at 1,000,000 atoms/$\mu m^2$ or less.

The present invention has been made in view of such problems, and it is an object of the present invention to provide a method that allows the cleaning of a polycrystalline silicon material while achieving the simplification and cost reduction of a producing process, from the new viewpoint of making a washing step itself unnecessary, whereas the conventional methods are based on the viewpoint of effectively removing residues adhering to a silicon material in a washing step once.

Solution to Problem

In order to solve the above-described problems, a method for producing a polycrystalline silicon rod according to the present invention comprises a step of housing a polycrystalline silicon rod immediately after synthesis by a Siemens method in a plastic bag in a reactor and removing the polycrystalline silicon rod out of the reactor after the housing.

In an aspect, the method for producing a polycrystalline silicon rod according to the present invention may comprise a step of sealing the plastic bag after removing the plastic bag out of the reactor.

Preferably, an inner surface of the plastic bag has been washed with a dilute acid aqueous solution.

Preferably, the dilute acid aqueous solution is a 0.1 to 10 wt % dilute nitric acid aqueous solution or dilute hydrochloric acid aqueous solution.

A polycrystalline silicon mass according to the present invention is obtained by crushing a polycrystalline silicon rod obtained by the above-described method.

Preferably, the crushing is performed in a clean room at a level of class 1,000 or more.

In a preferred aspect, concentrations of fluorine ions ($F^-$), nitrate ions ($NO_3^-$), and nitrogen dioxide ions ($NO_2^-$) remaining on a surface are each less than 0.2 ppbw.

Advantageous Effects of Invention

According to the present invention, steps conventionally considered as essential, such as washing, etching, and water washing, are not always necessary, and therefore the concentrations of fluorine ions ($F^-$), nitrate ions ($NO_3^-$), and nitrogen dioxide ions ($NO_2^-$) remaining on the surface can each be less than 0.2 ppbw. In addition, by covering with the plastic bag, the metal contamination levels decrease significantly. Moreover, when the handling according to the present invention is performed, surface contamination hardly proceeds even if the polycrystalline silicon rod is stored for a long period.

As a result, a method that allows the cleaning of a polycrystalline silicon material while achieving the simplification and cost reduction of a producing process is provided by the present invention.

BRIEF DESCRIPTION OF DRAWING

FIG. 1 is a flow diagram for explaining a process in Examples.

DESCRIPTION OF EMBODIMENTS

As described above, the conventional methods assume a series of washing steps such as etching and water washing for the cleaning of polycrystalline silicon and are based on the viewpoint of effectively removing residues adhering to the silicon material in these washing steps. In contrast to this, the present inventors have advanced study on the hypothesis that in the first place, the surface of a polycrystalline silicon rod immediately after synthesis by the Siemens method is not so contaminated and has considerably high cleanliness, and made the present invention.

If this hypothesis is correct, a series of steps such as subsequent washing, etching, and water washing are unnecessary if only the surface cleanliness of a polycrystalline silicon rod immediately after synthesis is maintained. Therefore, a method that allows the cleaning of a polycrystalline silicon material while achieving the simplification and cost reduction of a producing process is provided.

Therefore, in order to examine at which stage during a period until a polycrystalline silicon rod synthesized by the Siemens method is crushed and the polycrystalline silicon masses are commercialized surface contamination occurs mainly, the present inventors have prepared the following polycrystalline silicon rods, taken samples from respective polycrystalline silicon rods, and performed their surface analysis.

Sample 1: immediately after synthesis by the Siemens method

Sample 2: after being removed out of the reactor and transported by a dolly

Sample 3: after being allowed to stand in a storage chamber for several days after being transported by the dolly Sample 4: after being allowed to stand in a clean room (class 1,000) for 5 days Sample 5: after the completion of fracturing by a hammer 150 g of a fractured sample is transferred to a 500 ml clean Teflon (registered trademark) beaker, and 200 ml of a surface contaminant extract is added. The mixture is heated for 10 minutes for extraction such that only the surface is dissolved. The composition of the 200 ml of the surface contaminant extract is 100 ml of 50 wt % HF, 99 ml of water, and 1 ml of 30 wt % $H_2O_2$. After the extraction, 1 ml of the extract is separated into another clean container and heated and concentrated, and then a 1 wt % $HNO_3$ aqueous solution is added. After dissolution, simultaneous multielement measurement is performed by an ICP-MS apparatus. The apparatus used is 7500CS manufactured by Agilent.

The elements to be measured are 17 elements, Li, Na, Mg, Al, K, Ca, Ti, Cr, Mn, Fe, Co, Ni, Cu, Zn, Mo, Sn, and Pb.

As a result of such surface analysis, the following findings are obtained.

Sample 1: The surface cleanliness of the polycrystalline silicon rod immediately after synthesis by the Siemens method is considerably high.

Sample 2: The surface of the polycrystalline silicon rod after being removed out of the reactor and transported by the dolly is contaminated to some extent. Contamination is clearly noted particularly in places with which gloves come into contact in the operation of removal out of the reactor and in places that come into contact with the dolly.

Sample 3: The degree of contamination of the surface of the polycrystalline silicon rod after being allowed to stand in the storage chamber for several days after being transported by the dolly increases with the number of days of standing.

Sample 4: In the polycrystalline silicon rod after being allowed to stand in the clean room (class 1,000) for 5 days, contamination during the standing period is not noted.

Sample 5: Even in the polycrystalline silicon rod after the completion of fracturing by the hammer, contamination due to the crushing operation is not noted.

According to these results, it can be concluded that surface contamination mainly includes contamination by contact with gloves in removing a polycrystalline silicon rod from a reactor, contact with a dolly in transport, and the like and contamination in a storage environment.

That is, when a polycrystalline silicon rod removed from a reactor is not contaminated, the cleanliness of the surface is sufficiently high, and even if the polycrystalline silicon rod in the as-is state is fractured in a clean room, no problems occur.

In order to maintain the cleanliness of the surface of a polycrystalline silicon rod, it is important to avoid direct contact with various members and the like particularly in removal out of a reactor and in transport by a dolly, and the like.

Therefore, in the present invention, a polycrystalline silicon rod immediately after synthesis by the Siemens method is housed in a plastic bag in a reactor, and the polycrystalline silicon rod is removed out of the reactor after the housing.

The plastic bag is, for example, made of linear polyethylene (LLDPE) having a thickness of 100 to 500 μm. Immediately after the lid of the reactor is opened, the polycrystalline silicon rod is covered with this plastic bag from above and removed out of the reactor as it is. The LLDPE bag has excellent intensity and ductility and therefore is difficult to break.

Then, this plastic bag is sealed out of the reactor to hermetically seal the polycrystalline silicon rod, and the polycrystalline silicon rod is transported and the like in this state.

The inner surface of the plastic bag for such an application is washed with a dilute acid aqueous solution or the like prior to use.

Examples of the dilute acid aqueous solution can include a 0.1 to 10 wt % dilute nitric acid aqueous solution or dilute hydrochloric acid aqueous solution.

For example, the operation of placing about 200 ml of a 0.1 to 10 wt % dilute nitric acid aqueous solution inside the bag and spreading the aqueous solution over the entire inner surface is repeated about three times. Then, washing with ultrapure water is performed several times, and the bag is dried in a clean room at a level of class 1000 or more.

Examples

FIG. 1 is a flow diagram for explaining the process in the present Examples. First, a U-shaped polycrystalline silicon rod having a thickness of 130 to 150 mm and a length of 1800 to 2200 mm was synthesized by the Siemens method (S101). Previously, the inner surface of a 500 μm thick LLDPE bag was carefully washed with a 0.5 wt % nitric acid aqueous solution or a 10 wt % hydrochloric acid aqueous solution, and then washing with ultrapure water was repeated several times, and then the LLDPE bag was dried in a class 1000 clean room (S102).

For Examples 2 to 4 (E2 to 4), after the polycrystalline silicon rod was covered from above with the LLDPE bag after the washing and housed in the LLDPE bag in a reactor (S103), the polycrystalline silicon rod was removed out of the reactor (S104), and heat-sealed so that the lower portion of the rod did not protrude from the LLDPE bag, and stored in an enclosed state (S105).

For Example 1 (E1), the polycrystalline silicon rod was covered from above with an unwashed LLDPE bag and housed in the LLDPE bag in a reactor (S103), and the operations of S104 and S105 were performed in the same manner as the above.

After being stored in this state for a predetermined period (1 month for E1 to 3 and 6 months for E4), the polycrystalline silicon rod was transported to a class 1,000 clean room and unpacked in order to provide polycrystalline silicon masses. Crushing is preferably performed in a clean room at a level of class 1,000 or more.

On the other hand, for Comparative Examples 1 to 4 (C1 to 4), a polycrystalline silicon rod was crushed into polycrystalline silicon masses by a usual procedure without being covered with a plastic bag. For Comparative Examples 1 and 2, after chemical solution etching (8 minutes for C1 and 1 minute for C2), water washing was performed. This chemical solution etching is etching at ordinary temperature with a mixed acid liquid with HF (50 wt %):$HNO_3$ (70 wt %)=1:9 (volume ratio). For Comparative Example 3, neither chemical solution etching nor water washing was performed, and for Comparative Example 4, only water washing was performed.

For the fracturing operation, after the unpacking, two operators rapidly fractured the polycrystalline silicon rod by tungsten hammers, and another operator picked up the fractured nuggets, packed the nuggets in a product packing bag, measured the weight, and then heat-sealed the bag for enclosure for commercialization. The time required for this period was 10 to 15 minutes. In this connection, a polycrystalline silicon mass etching operation usually requires 2 to 3 hours.

For each of these samples, surface analysis was performed by an ICP-MS apparatus to examine the surface concentrations (ppbw) of 17 elements, Li, Na, Mg, Al, K, Ca, Ti, Cr, Mn, Fe, Co, Ni, Cu, Zn, Mo, Sn, and Pb, and the surface concentrations (ppbw) of fluorine ions ($F^-$), nitrate ions ($NO_3^-$), and nitrogen dioxide ions ($NO_2^-$) remaining on the surface.

The results are summarized in Table 1.

First, when Comparative Examples C1 to 4 are compared, it can be clearly read that the surface of the sample C3 not subjected to chemical solution etching is contaminated at high levels. From the comparison of Comparative Examples 1, 2, and 4, etching for about 1 minute is insufficient, and the metal contamination levels decrease considerably by etching for 8 minutes, but the concentrations of fluorine ions ($F^-$), nitrate ions ($NO_3^-$), and nitrogen dioxide ions ($NO_2^-$) increase significantly by an increase in etching time.

In contrast to this, each of the samples of Examples E1 to 4 is not subjected to etching, and therefore the concentrations of fluorine ions ($F^-$), nitrate ions ($NO_3^-$), and nitrogen dioxide ions ($NO_2^-$) remaining on the surface are each less than 0.2 ppbw.

In addition, from the comparison of Example E1 with Examples E2 to 4, a significant metal contamination reduction effect of covering with the plastic bag can be confirmed.

Moreover, from the comparison of Example E2 with a storage period of 1 month with Example E4 with a storage period of 6 months, it can be read that when the handling according to the present invention is performed, surface contamination hardly proceeds even if the polycrystalline silicon rod is stored for a long period.

In this manner, according to the present invention, steps conventionally considered as essential, such as washing, etching, and water washing, are not always necessary, and therefore polycrystalline silicon masses having high surface cleanliness are obtained while the simplification and cost reduction of the producing process are achieved.

TABLE 1

| Sample | E1 | E2 | E3 | E4 | C1 | C2 | C3 | C4 |
|---|---|---|---|---|---|---|---|---|
| Inner surface washing | No | 0.5 wt % | 10 wt % | 0.5 wt % | — | — | — | — |
| Storage period | 1 month | 1 month | 1 month | 6 months | — | — | — | — |
| Etching time | 0 | 0 | 0 | 0 | 8 minutes | 1 minute | 0 | 0 |
| Water washing | No | No | No | No | Yes | Yes | No | Yes |
| Li | <2 | <2 | <2 | <2 | <2 | <2 | 2 | <2 |
| Na | 124 | 8 | 7 | 7 | 14 | 13 | 7,840 | 281 |
| Mg | 187 | 4 | 4 | 4 | 4 | 60 | 354 | 40 |
| Al | 8 | 2 | 2 | 3 | <2 | 83 | 459 | 67 |
| K | 9 | <2 | <2 | <2 | <2 | 24 | 1,120 | 87 |
| Ca | 54 | 3 | 4 | 3 | 2 | 64 | 954 | 106 |
| Ti | 145 | 2 | 2 | 2 | <2 | 124 | 189 | 41 |
| Cr | 24 | 5 | 6 | 4 | 7 | 40 | 545 | 74 |

TABLE 1-continued

| Sample | E1 | E2 | E3 | E4 | C1 | C2 | C3 | C4 |
|---|---|---|---|---|---|---|---|---|
| Mn | 21 | <2 | <2 | <2 | <2 | 18 | 87 | 24 |
| Fe | 108 | 6 | 5 | 7 | 5 | 146 | 12,400 | 296 |
| Co | 41 | 3 | 2 | 3 | <2 | 5 | 186 | 5 |
| Ni | 20 | <2 | <2 | <2 | <2 | 13 | 2,450 | 35 |
| Cu | 5 | <2 | <2 | <2 | <2 | 3 | 985 | 16 |
| Zn | 15 | <2 | <2 | <2 | <2 | 81 | 249 | 586 |
| Mo | <2 | <2 | <2 | <2 | <2 | 2 | 3 | 3 |
| Sn | <2 | <2 | <2 | <2 | <2 | 2 | 2 | 1 |
| Pb | <2 | <2 | <2 | <2 | <2 | 2 | 3 | 3 |
| $F^-$ | <0.2 | <0.2 | <0.2 | <0.2 | 23 | 4 | <0.2 | <0.2 |
| $NO_3^-$ | <0.2 | <0.2 | <0.2 | <0.2 | 116 | 2 | <0.2 | <0.2 |
| $NO_2^-$ | <0.2 | <0.2 | <0.2 | <0.2 | 98 | <0.2 | <0.2 | <0.2 |

INDUSTRIAL APPLICABILITY

As described above, a method that allows the cleaning of a polycrystalline silicon material while achieving the simplification and cost reduction of a producing process is provided by the present invention.

The invention claimed is:

1. A method for removing a polycrystalline silicon rod produced by a Siemens method from a reactor, comprising:
   housing the polycrystalline silicon rod, immediately after a lid of the reactor is opened following synthesis by the Siemens method, in a plastic bag made of linear polyethylene (LLDPE) having a thickness of 100 to 500 μm in the reactor, and removing the polycrystalline silicon rod out of the reactor after the housing; and
   sealing the plastic bag after removing the plastic bag out of the reactor;
   wherein an inner surface of the plastic bag has been washed with a dilute acid aqueous solution, and
   wherein the dilute acid aqueous solution is a 0.1 to 10 wt % dilute nitric acid aqueous solution or a 0.1 to 10 wt % dilute hydrochloric acid aqueous solution, and the plastic bag has been dried in a clean room at a level of class 1000 or more after the washing.

* * * * *